United States Patent [19]

Ballato

[11] Patent Number: 4,607,239
[45] Date of Patent: Aug. 19, 1986

[54] ADJUSTMENT OF THE FREQUENCY-TEMPERATURE CHARACTERISTICS OF CRYSTAL OSCILLATORS

[75] Inventor: Arthur Ballato, Long Branch, N.J.

[73] Assignee: The United States of America as represented by the Secretary of the Army, Washington, D.C.

[21] Appl. No.: 707,107

[22] Filed: Feb. 28, 1985

[51] Int. Cl.⁴ .......................... H03L 1/00; H03B 5/32
[52] U.S. Cl. ..................................... 331/176; 331/158
[58] Field of Search ................. 331/158, 176; 330/289

[56] References Cited

U.S. PATENT DOCUMENTS 3,995,233 11/1976 Waku ................................ 331/176

OTHER PUBLICATIONS

"Apparent Orientation Shifts of Mass-Loaded Plate Vibrators", A. Ballato, *Proceedings of IEEE*, vol. 64, Sep. 1976, pp. 1449-1450.

*Temperature Compensated Crystal Oscillator (TCXO) Design Aids: Frequency-Temperature Resonator Characteristics as Shifted by Series Capacitors,* A. Ballato, Technical Report, ECOM-4498, U.S. Army Electronics Command, Fort Monmouth, N.J., May, 1977, 59 pages.

"Frequency-Temperature-Load Capacitance Behavior of Resonators for TCXO Application", *IEEE Transactions on Sonics and Ultrasonics,* A. Ballato, vol. SU-25, No. 4, Jul., 1978, pp. 185-191.

*Primary Examiner*—Gene Wan
*Attorney, Agent, or Firm*—Anthony T. Lane; Jeremiah G. Murray; John T. Rehberg

[57] ABSTRACT

The frequency-temperature characteristic of the piezoelectric resonator in a temperature compensated crystal oscillator is adjusted by the inclusion of an equivalent inductive reactance connected in series with a piezoelectric crystal resonator coupled to an oscillator circuit, with the equivalent inductive reactance being realized in the form of an inductorless Maxwell type bridge circuit containing the resonator. Such an arrangement provides a much larger variation in the temperature-frequency characteristic than can be realized with a conventional capacitor in series with the piezoelectric resonator.

8 Claims, 7 Drawing Figures

ADJUSTMENT OF THE FREQUENCY-TEMPERATURE CHARACTERISTICS OF CRYSTAL OSCILLATORS

The invention described herein may be manufactured or used by or for the Government for governmental purposes without the payment of any royalties thereon or therefor.

BACKGROUND OF THE INVENTION

1. Field of the Invention

This invention relates generally to temperature compensated crystal oscillators utilizing piezoelectric resonators and more particularly to the alteration of the frequency-temperature characteristic of a piezoelectric resonator of a temperature compensated crystal oscillator.

2. Background of the Invention

As is well known, the frequency-temperature (f-T) behavior of a piezoelectric resonator depends upon the elastic, piezoelectric and dielectric properties of the piezoelectric material as well as the temperature coefficients (TC) of these material quantities. The influence of these material quantities relative to one another depends upon where on the reactance vs. frequency curve the resonator is operated. It has been further shown that the temperature coefficient at resonance differs from that at antiresonance and, as a result, resonators are normally operated between these frequencies by placing a load capacitor in series with the crystal and coupling the series combination of capacitor and crystal resonator into an oscillator. The effect of the capacitor is to adjust the resonator's operating or load frequency until the reactance of the combination is approximately zero so that the crystal resonator is forced to operate in an inductive region with its reactance equal in magnitude to that of the series capacitor. Furthermore, the effect of operation between resonance and antiresonance has been described by Arthur Ballato, the present inventor, in the following publications which are meant to be included herein by reference: "Apparent Orientation Shifts of Mass-Loaded Plate Vibrators", A. Ballato, *Proceedings of IEEE*, Volume 64, September, 1976, pp. 1449–1450; *Temperature Compensated Crystal Oscillator (TCXO) Design Aids: Frequency-Temperature Resonator Characteristics as Shifted by Series Capacitors,* A. Ballato, Technical Report, ECOM-4498, U.S. Army Electronics Command, Fort Monmouth, N.J. May, 1977, 59 pp; and "Frequency-Temperature-Load Capacitance Behavior of Resonators for TCXO Application", *IEEE Transactions on Sonics and Ultrasonics,* A. Ballato, Volume SU-25, Number 4, July, 1978, pp. 185–191.

The foregoing pertains not only to bulk wave resonators, but surface wave and shallow bulk wave resonators as well. Furthermore, it is true for any piezoelectric material e.g. quartz, lithium niobate, lithium tantalate, berlinite, barium titanate etc. Only the size of the effect will vary.

With respect to a series load capacitor, however, two basic limitations are present, namely the resonance-antiresonance region is normally very narrow since adjustment of the value of the load capacitor from infinity (short circuit) to zero (open circuit) only varies the frequency between these limits, and the range of the temperature coefficient adjustment, as opposed to frequency adjustment, is also very small.

Accordingly, it is an object of the present invention to provide an improvement in temperature compensated crystal oscillators.

It is a further object of the present invention to provide an improvement in the frequency-temperature adjustment region of a piezoelectric resonator.

And it is yet another object of the invention to provide a range of frequency-temperature adjustment outside of the resonance-antiresonance region of a crystal resonator incorporated in a temperature compensated crystal oscillator.

SUMMARY

Briefly, the foregoing and other objects are achieved by the inclusion of an equivalent load inductive reactance coupled in series with the crystal resonator of a temperature compensated crystal oscillator, with the equivalent inductive reactance being realized by an inductanceless bridge circuit having a first pair of opposing arms respectively comprised of resistive impedances while the other pair of opposing arms is respectively comprised of the crystal resonator, and a parallel circuit including a variable capacitive reactance and a variable resistive impedance. Such a configuration is known in the art as a Maxwell bridge circuit when the arm occupied by the crystal resonator is replaced by a series resistor and an inductor. In the neighborhood of the resonance region of the crystal it may be represented as a series combination of a resistor plus inductor, and, further, by varying the values of the parallel combination of the resistive impedance and capacitance arm of the bridge, the arm opposite to the crystal, an inductive reactance additional to that of the crystal can effectively be made to appear in series with the crystal resonator.

BRIEF DESCRIPTION OF THE DRAWINGS

While the present invention is defined in the claims annexed to and forming a part of the specification, a better understanding can be had by reference to the following description when taken in conjunction with the accompanying drawings in which:

DETAILED DESCRIPTION

Figure 1:
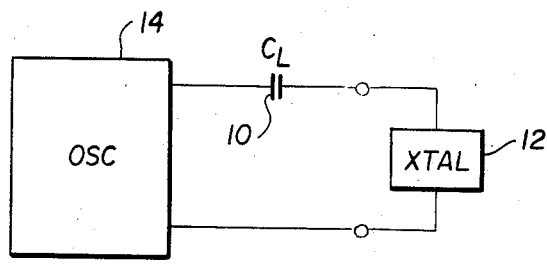
FIG. 1 is a simplified electrical schematic diagram illustrative of a temperature compensated crystal oscillator in accordance with the known prior art.
Figure 2:
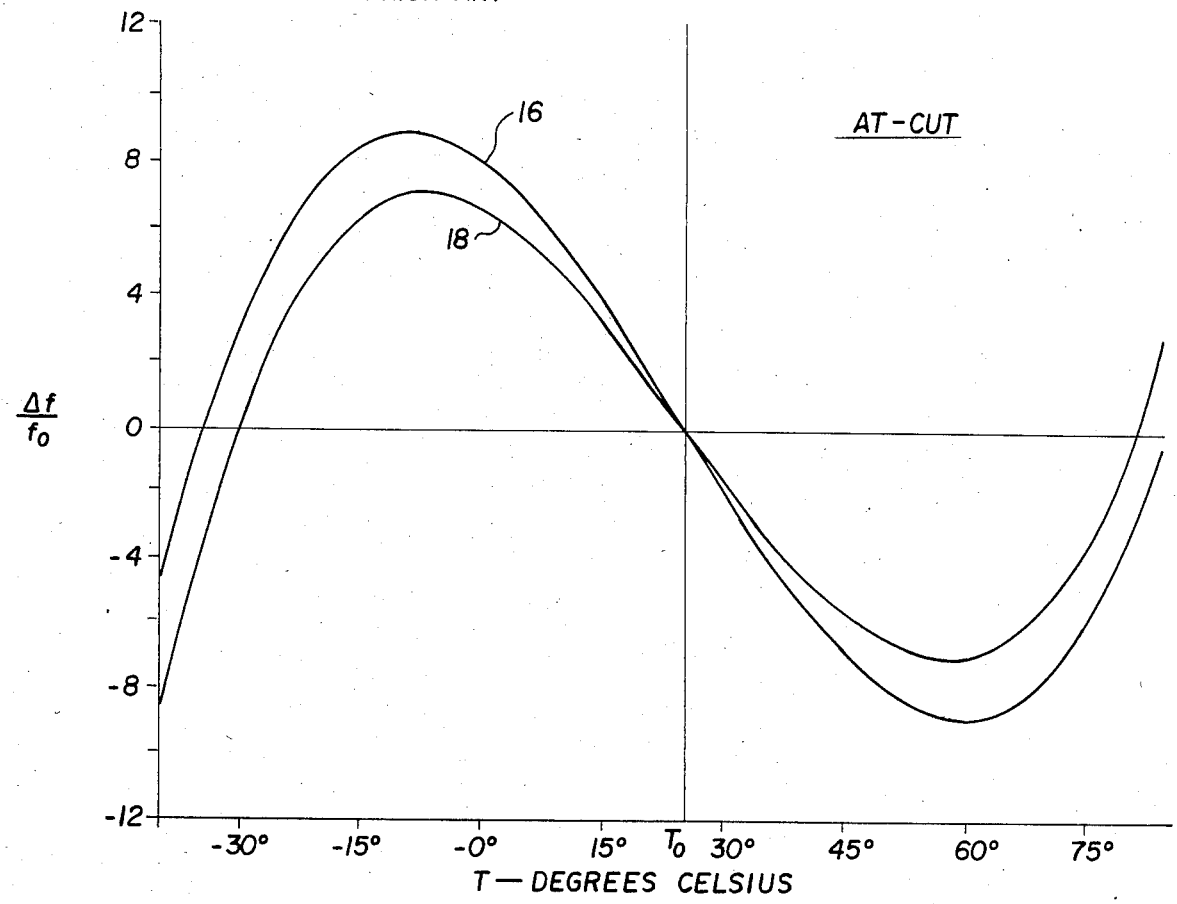
FIG. 2 is a frequency vs. temperature characteristic of a crystal resonator in accordance with the prior art shown in FIG. 1.

Referring now to the drawings and more particularly to FIG. 1, shown thereat is a conventional temperature compensated crystal oscillator which includes a series capacitor for shifting the frequency-temperature resonator characteristics. As shown, a series load capacitor 10 having a value $C_L$ is connected to a piezoelectric crystal resonator 12. The series combination of the capacitor 10 and the crystal 12 are coupled to an oscillator circuit 14. The influence of the series capacitor 10 upon the operating frequency of the crystal and upon the frequency temperature coefficient is well known, having been treated, for example, in the afore-mentioned publication entitled, "Frequency-Temperature-Load Capacitance Behavior of Resonators for TXCO Application". In accordance with this publication, an AT cut quartz resonator 12 exhibits a frequency-temperature characteristic as shown in FIG. 2 where the curve 16 is illustrative of the frequency vs. temperature variation of the crystal 12 without the series load capacitor 10 while the curve 18 is illustrative of the same characteristic with the inclusion of the series load capacitor 10. As indicated, the presence of the capacitor 10 reduces the peak-to-peak frequency deviation $\Delta f/f = (f - f_O)f_O$ where $f_O$ is the operating frequency of interest at $T_O = 25°$ C. and makes the resonator appear as if it had a reduced crystallographic angle of cut.

As noted above, the problems associated with the series load capacitor 10 are basically two: the resonance-antiresonance region is very narrow, i.e., the frequency difference between where the value $C_L$ approaches zero and the load frequencies approach antiresonance, and where $C_L$ approaches infinity and the load frequencies approach resonance is very small; and the range of temperature coefficient adjustment, as opposed to frequency adjustment, is likewise very small.

Figure 3:
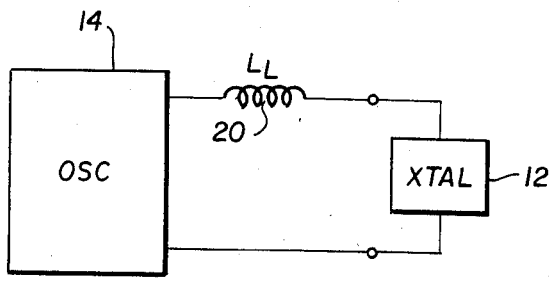
FIG. 3 is a simplified schematic diagram of a temperature compensated crystal oscillator in accordance with the subject invention.

Referring now to FIG. 3, the present invention has for its object overcoming the inherent limitations of the series load capacitor 10 as shown in FIG. 1, by now including a series inductor in place of the capacitor. This is shown schematically in FIG. 3 by an inductance 20 having a value $L_L$ in series with the crystal resonator 12, with the combination being coupled to the oscillator 14 in the same manner as shown in FIG. 1.

Due to the fact that the insertion of a physical inductor in series with a crystal resonator is not usually desirable because of its cost, size and weight, and its relatively poor temperature behavior, the present invention contemplates synthesizing the inductive reactance of the inductor 20 by means of a Maxwell bridge type circuit, a circuit well known to those skilled in the art.

Figure 4:
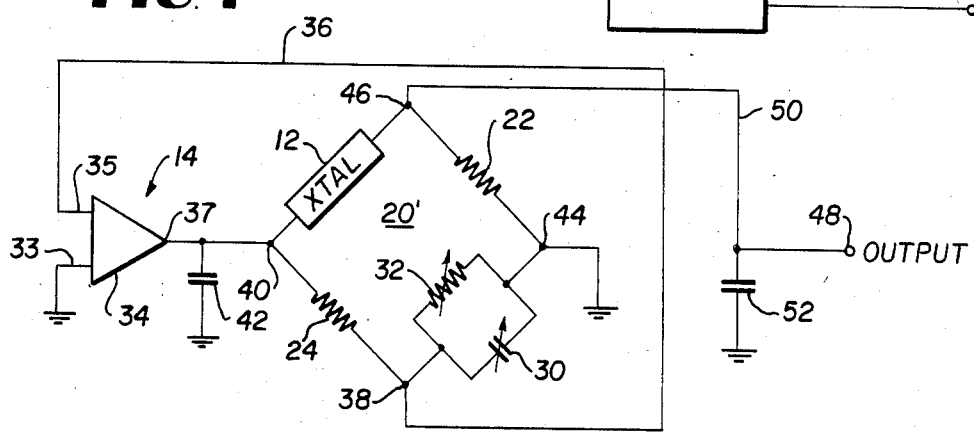
FIG. 4 is a simplified schematic diagram of the preferred embodiment of the invention.

Referring now to FIG. 4, a Maxwell bridge type circuit 20' is shown including a first pair of opposite arms comprised of fixed resistors 22 and 24 and a second pair of opposite arms respectively comprised of the crystal resonator 12, with the opposite arm comprised of a variable capacitor 30 coupled in parallel to a variable resistor 32.

Further as shown in FIG. 4, the oscillator 14 is comprised of an operational amplifier 34 which may be comprised of an integrated circuit including one or more transistors plus their associated biasing circuitry, not shown. The operational amplifier has one input 33 returned to ground, while its other input is connected to a positive feedback path comprised of signal lead 36 connected to the bridge terminal 38 which is common to the fixed resistor 24 and the parallel combination of variable resistor 32 and variable capacitor 30. The output 37 of the operational amplifier 34 is shown connected to bridge terminal 40 which is commonly connected to the crystal 12 and the fixed resistor 24. A capacitor 42 is also coupled therefrom to ground. The opposite bridge terminal 44 which is common to the fixed resistor 22 and the variable resistor 32 and capacitor 30 is connected to ground while the fourth and last bridge terminal 46 which is common to the crystal 12 and the fixed resistor 22 is connected to a signal output terminal 48 via a signal lead 50. A capacitor 52 is also shown coupled from the output terminal 41 to ground.

Considering now the operation of FIG. 4, any immittance may be represented either as a series impedance combination of resistance and reactance or as a parallel admittance combination of conductance and susceptance. If the immittance is constant, the elements of either combination are of course constant and if the immittance is frequency dependent, the elements will be functions of frequency. As is well known, a crystal is a frequency sensitive immittance, and so its representation as a simple two-element series or parallel combination, as described, results in a frequency sensitive element.

Accordingly at a fixed frequency, the immittance of the crystal 12 will be a constant, and so the series or parallel elements will be constants. In FIG. 4, adjustment of the Maxwell bridge elements 30 and 32 can balance the series resistance and reactance of the crystal. If the capacitor 30 is moved from the balance point, then the reactance so added to the bridge can be considered as arising equivalently from the series reactance that represents the crystal, i.e., the crystal appears as if it had either a capacitor or inductor placed in series with it, depending upon whether the capacitor 30 is increased or decreased from the balance point. Thus, adjustments of the capacitor 30 are made to produce the effects of an inductor or capacitor in series with the capacitor. A configuration alternative to that of the described Maxwell bridge, and that may also be used advantageously, is the Hay bridge. The Hay bridge is identical to a Maxwell bridge except that in the configuration shown in FIG. 4, the parallel resistance-capacitance combination 30, 32 is replaced by a series resistance-capacitance combination. Adjustment of the capacitor in the Hay bridge arrangement from the balance point likewise introduces the equivalent of an inductor or capacitor in series with the crystal. In practice, the bridge 20' may be fabricated in the form of miniature RF large-scale-integration (LSI) semiconductor circuit components.

Figure 5A:
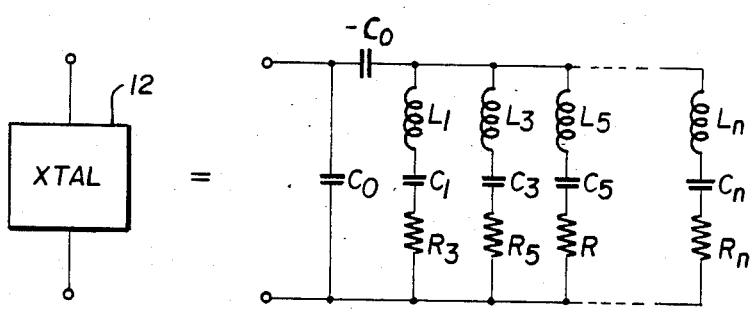
FIGS. 5A and 5B are electrical schematic diagrams of the equivalent circuit of a piezoelectric crystal.
Figure 5B:
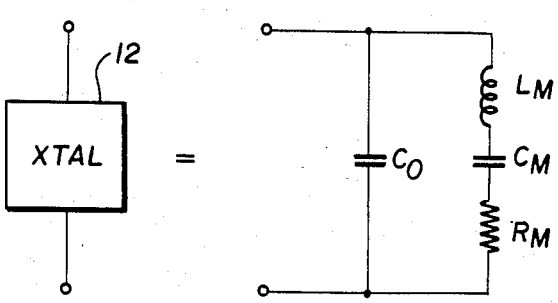

To demonstrate the enhanced operational effect provided by a series inductor in place of a series capacitor, the following discussion will be helpful in understanding the inventive concept of this invention. Accordingly, consider a crystal resonator 12 the complete equivalent circuit of which is shown in FIG. 5A. The simple thickness modes M = 1, 3, 5 . . . of flat piezoelectric plate resonators as represented in FIG. 5A are those having a laterally unvarying distribution of mechanical motion. For these modes, the frequencies consist of fundamental (M = 1) and thickness overtones (M = 3, 5, . . . ), and each frequency, fundamental and overtone has a simple equivalent circuit arm of motional parameters consisting of a series circuit including an inductance L, a capacitance C and a resistor R where the subscript 1 . . . n indicates the value of M. The arms of each harmonic are in parallel, and the whole is shunted by a capacitance $+C_O$, the latter being representative of the static capacitance associated with the resonator and is found from the plate thickness and crystal dielectric constant. Appearing between the motional arms and the shunt capacitance $+C_O$ is a series capacitor of value $-C_O$. The $-C_O$ is often omitted as shown in FIG. 5B whereupon the circuit is referred to as the Butterworth-VanDyke(BVD) network. Where the $-C_O$ is included, the network is called a modified BVD(mBVD) circuit. In a mBVD circuit (FIG. 5B) all inductance values $L_M$ for all the overtones M=1,3,5,... are equal. The capacitance values $C_M$, however, vary depending upon the overtone M and can be expressed as:

$$C_M = C_1/M^2 \qquad (1)$$

In the vicinity of any one resonance, the other motional arms of FIG. 5A are negligible in effect, and the BVD network of FIG. 5B is descriptive of the circuit effect of the crystal resonator.

The resonance frequency $f_R$ and the antiresonance frequency $f_A$, at any given harmonic M, are those frequencies for which the BVD network exhibits reactance zeroes and poles, respectively. The normalized frequency difference between the zero and pole of a given overtone M, moreover, is a function of the capacitance ratio $r_M$ between $C_O$ and $C_M$ which is expressed as:

$$r_M = C_O/C_M \qquad (2)$$

Consider now a generalization of conventional practice as shown in FIG. 1 where a series capacitor 10 is placed in series with the crystal resonator 12. The generalization consists of an arbitrary reactance $X_{in}$, in series with the crystal resonator 12. The reactance $X_{in}$ may be considered positive ($+X_{in}$) when an inductor is placed in series with the resonator or negative ($-X_{in}$) when a capacitor is used. When the reactance is negative representing a value $C_L$, as shown in FIG. 1, in accordance with the known prior art, then the variations in reactance from zero to minus infinity pull the lower reactance zero of the combination from the resonance frequency $f_R$ to an antiresonance frequency $f_A$ for any overtone M as follows:

$$f_{RM} = f_M \cdot (1 - 1/r_M)^{\frac{1}{2}}, \text{ and} \qquad (3)$$

$$f_{AM} = f_M \cdot (1), \qquad (4)$$

where, $$f_M = (4\pi^2 L_M C_M)^{-\frac{1}{2}} \qquad (5)$$

The maximum frequency shift can then be stated in normalized form as:

$$(f_{AM} - f_{RM})/f_{AM} \approx \tfrac{1}{2} r_M. \qquad (6)$$

For intermediate values of $C_L$ one obtains:

$$f_{LM}/f_M = [1 - (1-\alpha)/r_M]^{\frac{1}{2}}, \qquad (7)$$

where $$\alpha = C_O/(C_O + C_L).$$

By permitting $X_{in}$ to be positive, i.e. inductive, $f_{LM}$ may be made less than $f_{RM}$ or greater than $f_{AM}$.

For a given value of $X_{in}$, the frequencies at which the crystal may operate are found from the cubic equation for normalized frequency variable $\Omega$:

$$x \cdot \Omega(\Omega^2 - 1) + \Omega^2 - (1 - 1/r) = 0 \qquad (8)$$

where $$x = X_{in}/|X_o|; \; |X_o| \cdot (2\pi f_1)C_o) = 1;$$

$$\Omega = f/f_1; \text{ and } 4\pi^2 f_1^2 L_1 C_1 = 1.$$

One root yields $\Omega < 0$ this root is unphysical and is discarded; the second root lies between 0 and $f_R$; and the third lies above $f_A$. The second and third roots may be used.

As seen in FIG. 2, the presence of a series load capacitor $C_L$ (negative $X_{in}$) shifts the frequency-temperature behavior. This effect may be greatly enhanced by the use of a positive $X_{in}$. When $C_L$ is used, the shift in temperature coefficient (TC) can only be as large as $T_R/r_M$, where $r_M$ is the ratio from equation (2), a $T_R$ is the TC of the piezoelectric coupling constant. $T_R$ is about $+100*10^{-6}/°C$. for AT cut quartz, and about $+400*10^{-6}/°C$. for SC cut quartz. When temperature coefficient shift is scaled to the corresponding maximum shift $T_R/r_M$ obtainable with a load capacitor, the shift in temperature coefficient $t_x$ can be plotted as a function of a normalized frequency variable $\Delta$, which is scaled to the pole-zero frequency spacing from equations (3) and (4). $\Delta$ is equal to:

$$\Delta = (\Omega - 1)/[1 - \sqrt{1 - 1/r}\,]. \qquad (9)$$

Figure 6:
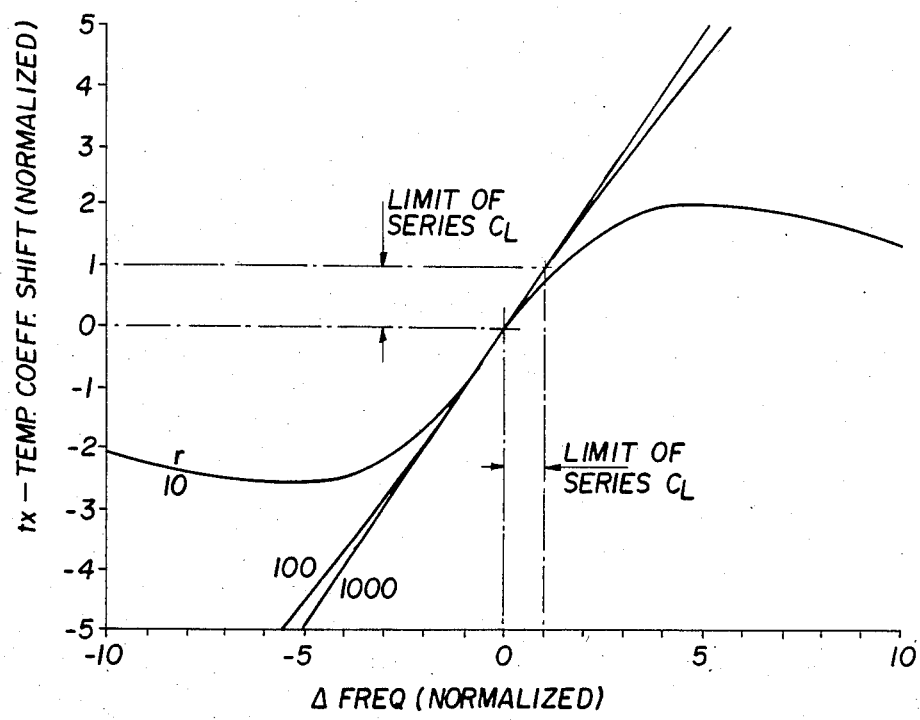
FIG. 6 is a graph helpful in understanding the principle of the subject invention.

A plot of $\Delta$ for various r values is shown in FIG. 6. For any given r value, e.g. r=10, r=100, r=1000, the limits of $\Delta$ occur approximately at:

$$\Delta \approx \pm(2r)^{\frac{1}{2}} \qquad (10)$$

while the corresponding values of $t_x$ are $$t_x \approx \pm(r/2)^{\frac{1}{2}} \qquad (11)$$

Therefore, at the limits, $$t_x \approx \Delta/2. \qquad (12)$$

At the origin of FIG. 6 where $\Delta = 0$, the slope is very nearly unity. The region covered by a series capacitor $C_L$, i.e., $-X_{in}$, ranges from $\Delta = 0$ to $+1$ as shown by FIG. 6. Accordingly, $t_x$ also ranges from 0 to $+1$. It is seen that by the use of a series inductance $L_L$, i.e., $+X_{in}$, which may be realized by using an inductorless Maxwell bridge as shown in FIG. 4, a much larger variation in temperature compensation may be realized because one can operate beyond the limit of the series $C_L$.

Thus what has been shown and described is a crystal oscillator which by the use of a series inductor in combination with the piezoelectric resonator and coupled to oscillator circuit means, the operating frequency of the resonator may be brought below the resonance frequency $f_R$ or it may be raised above the antiresonance frequency $f_A$, and its frequency-temperature coefficient may be adjusted.

Having shown and described what is at present considered to be the preferred method and embodiment of the invention, it should be noted that the foregoing detailed description has been made by way of illustration and not limitation. Accordingly, all modifications, changes and alterations coming within the spirit and scope of the invention are herein meant to be included.

I claim:

1. A temperature compensated oscillator comprising:
   a crystal resonator;
   a bridge circuit including a first pair of opposing arms each comprised solely of resistive impedance means; a second pair of opposing arms respectively comprised of said crystal resonator and a parallel circuit including variable resistive impedance means and a variable capacitive reactance means; a first bridge terminal common to one said resistive impedance means of said first pair of opposing arms and said crystal resonator of said second pair of opposing arms, a second bridge terminal common to the other said resistive impedance means of said first pair of arms and said crystal resonator, a third bridge terminal common to said other resistive impedance means and said parallel circuit of said second pair of arms, and a fourth bridge terminal common to said one resistive impedance means and said parallel circuit.

2. The oscillator as defined by claim 1 and wherein said oscillator circuit means includes operational amplifier means having a first and second input, and an output, said first input being coupled to a point of reference potential, said second input being coupled to a feedback signal appearing at said fourth bridge terminal and said output being coupled to said first bridge terminal, and additionally including a circuit connection of said third bridge terminal to said point of reference potential, and an oscillator output signal terminal coupled to said second bridge terminal.

3. The oscillator as defined by claim 2 wherein said arms comprised solely of resistive impedance means are each comprised of at least one fixed resistor and wherein said arm comprised of said parallel circuit is comprised of at least one variable capacitor and at least one variable resistor.

4. The oscillator as defined by claim 2 and additionally including first capacitive reactance means commonly coupled from said output of said operational amplifier means and said first bridge terminal to said point of reference potential and second capacitive reactance means commonly coupled from said output signal terminal and said second bridge terminal to said point of reference potential.

5. A temperature compensated oscillator comprising:
a crystal resonator;
a bridge circuit including a first pair of opposing arms each composed solely of resistive impedance means; a second pair of opposing arms respectively comprised of said crystal resonator and a series circuit including variable resistive impedance means and variable capacitive reactance means; a first bridge terminal common to one of said resistive impedance means of said first pair of opposing arms and said crystal resonator of said second pair of opposing arms, a second bridge terminal common to the other said resistive impedance means of said first pair of arms and said crystal resonator, a third bridge terminal common to said other resistive impedance means and said series circuit of said second pair of arms, and a fourth bridge terminal common to said one resistive impedance means and said series circuit.

6. The oscillator as defined by claim 5 and wherein said oscillator circuit means includes operational amplifier means having a first and second input, and an output, said first input being coupled to a point of reference potential, said second input being coupled to a feedback signal appearing at said fourth bridge terminal and said output being coupled to said first bridge terminal, and additionally including a circuit connection of said third bridge terminal to said point of reference potential, and an oscillator output signal terminal coupled to said second bridge terminal.

7. The oscillator as defined by claim 6 wherein said arms comprised solely of resistive impedance means are each comprised of at least one fixed resistor and wherein said arm comprised of said series circuit is comprised of at least one variable capacitor and at least one variable resistor.

8. The oscillator as defined by claim 6 and additionally including first capacitive reactance means commonly coupled from said output of said operational amplifier means and said first bridge terminal to said point of reference potential and second capacitive reactance means commonly coupled from said output signal terminal and said second bridge terminal to said point of reference potential.

* * * * *